United States Patent
Yap et al.

(10) Patent No.: US 7,330,665 B2
(45) Date of Patent: Feb. 12, 2008

(54) OPTICAL FREQUENCY MODULATED TRANSMITTER

(75) Inventors: Daniel Yap, Newbury Park, CA (US); David M. Pepper, Malibu, CA (US); Gilmore J. Dunning, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 674 days.

(21) Appl. No.: 10/630,189

(22) Filed: Jul. 29, 2003

(65) Prior Publication Data

US 2004/0101317 A1 May 27, 2004

Related U.S. Application Data

(60) Provisional application No. 60/428,633, filed on Nov. 22, 2002.

(51) Int. Cl.
*H04B 10/04* (2006.01)
(52) U.S. Cl. .................. 398/187; 398/192; 398/196
(58) Field of Classification Search ............... 398/187, 398/192, 193, 195, 196
See application file for complete search history.

(56) References Cited

U.S. PATENT DOCUMENTS

| | | | | |
|---|---|---|---|---|
| 4,649,351 A | * | 3/1987 | Veldkamp et al. | 359/349 |
| 4,755,016 A | * | 7/1988 | DeLoach et al. | 398/195 |
| 4,862,467 A | * | 8/1989 | Carter et al. | 372/18 |

2002/0147400 A1* 10/2002 Chance .................. 600/476

OTHER PUBLICATIONS

"Multiple Oscillator Locking Via Optical Link," Proceedings of the European Microwave Conference, Paris, pp. 578-583 to Herczeld et al.*
"Phase Locking of Lasers By An Injected Signal," Optics Letters, vol. 7 No. 9, pp. 417-419, Sep. 1982 to Chow et al.*
Bhattacharya, M., et al., "A Method for Generation of Optical FM Signal Through Injection Locking," *Journal of Lightwave Technology*, vol. 16, No. 4, pp. 656-660 (Apr. 1998).
Bordonalli, A.C., et al., "High-Performance Phase Locking of Wide Linewidth Semiconductor Lasers by Combined Use of Optical Injection Locking and Optical Phase-Lock Loop," *Journal of Lightwave Technology*, vol. 17, No. 2, pp. 328-342 (Feb. 1999).

(Continued)

*Primary Examiner*—Christina Leung
(74) *Attorney, Agent, or Firm*—Ladas & Parry (57) ABSTRACT

An optical frequency modulated transmitter includes a plurality of separately phased-controlled slave lasers, the outputs of which are combined to form a single output beam of the transmitter. A master optical oscillator outputs an optical signal for injection locking the plurality of slave lasers, the optical signal being frequency modulated directly in the master optical oscillator or externally thereof. Additionally, a method of frequency modulating an optical beam is disclosed using a plurality of slave lasers. Each of the slave lasers has an output, the outputs of which are combined to form the optical beam. The plurality of slave lasers is injection locked to an optical output of a master oscillator. The optical output of the master oscillator is frequency modulated before the optical output is applied to the plurality of lasers. Each slave laser of the plurality is phased controlled relative to other slave lasers of the plurality.

19 Claims, 5 Drawing Sheets

OTHER PUBLICATIONS

Goldberg, L., et al., "Injection Locking and Single-Mode Fiber Coupling of a 40-Element Laser Diode Array," *Appl. Phys. Lett.*, vol. 50, No. 24, pp. 1713-1715 (Jun. 15, 1987).

Hui, R., et al., "Injection Locking in Distributed Feedback Semiconductor Lasers," *IEEE Journal of Quantum Electronics*, vol. 27, No. 6, pp. 1688-1695 (Jun. 1991).

Kikuchi, K., et al., "Amplitude-Modulation Sideband Injection Locking Characteristics of Semiconductor Lasers and Their Application," *Journal of Lightwave Technology*, vol. 6, No. 12, pp. 1821-1830 (Dec. 1988).

Kobayashi, S., et al., "Optical FM Signal Amplification by Injection Locked and Resonant Type Semiconductor Laser Amplifiers," *IEEE Journal of Quantum Electronics*, vol. QE-18, No. 4, pp. 575-581 (Apr. 1982).

Kobayashi, S., et al., "Optical Phase Modulation in an Injection Locked AlGaAs Semiconductor Laser," *IEEE Transactions on Microwave Theory and Techniques*, vol. MTT-30, No. 10, pp. 1650-1657 (Oct. 1982).

Langley, L.N., et al., "Optical Phase Locked Loop Signal Sources for Phased Array Communications Antennas," *SPIE*, vol. 3160, pp. 142-153 (1997).

Meng, X.J., et al., "Improved Intrinsic Dynamic Distortions in Directly Modulated Semiconductor Lasers by Optical Injection Locking," *IEEE Transactions on Microwave Theory and Techniques*, vol. 47, No. 7, pp. 1172-1176 (Jul. 1999).

Okai, M., et al., "Complex-Coupled $\lambda/4$-Shifted DFB Lasers with a Flat FM Response," *IEEE Journal of Selected Topics in Quantum Electronics*, vol. 1, No. 2, pp. 461-465 (Jun. 1995).

Yap, D., et al., "Monolithic Optoelectronic Receiver Arrays for Analogue Links," *Electronics Letters*, vol. 33, No. 12, pp. 1078-1080 (Jun. 5, 1997).

Chow, W.W., "Phase Locking Of Lasers By An Injected Signal," *Optics Letters*, vol. 7, No. 9, pp. 417-419 (Sep. 1982).

Herczeld, P.R., et al., "Multiple Oscillator Locking Via Optical Link," *Proceedings of the European Microwave Conference*, Paris, pp. 578-583 (Sep. 13, 1985).

Kapon, E., et al., "Phase Blocking Characteristics of coupled ridge waveguide InP/InGaAsP diode lasers", Appl. Phys. Lett. 45 (11) pp. 1159-1161 (Dec. 1, 1984).

Carlson, N.W., et al., "Electronic Beam Steering in monolithic grating-surface-emitting diode laser arrays", Appln. Phys. Lett. 53 (23) pp. 2275-2277 (Dec. 5, 1998).

\* cited by examiner

OPTICAL FREQUENCY MODULATED TRANSMITTER

BACKGROUND OF THE INVENTION

This application claims the benefits of U.S. Provisional Application Ser. No. 60/428,633 dated Nov. 22, 2002, which application is incorporated herein by reference.

BACKGROUND OF THE INVENTION

Optical frequency modulation (OFM) is believed to be a preferred format for signals carried in free-space optical links. When compared with the conventional technique of amplitude modulation (AM) and direct detection, the signal-to-noise ratio achieved with OFM is better by the amount $(f_{FM}/\Delta f)^2$, where $f_{FM}$ is the Frequency Modulation (FM) index and $\Delta f$ is the maximum modulation frequency (or the signal bandwidth). The benefit of OFM is especially important for applications in which the optical power incident on the receiver station is weak. This would typically be the case for a free-space optical link, which achieves power-efficient performance.

Typically, OFM is achieved by directly modulating the current driving a semiconductor laser, which results in both amplitude modulation and frequency modulation of the output. See FIG. 1(a). Any residual amplitude modulation (RAM) of a frequency-modulated (FM) laser will degrade the signal-to-noise ratio of a communications link or degrade the sensitivity of a remote sensing apparatus. This is because that amplitude modulation is indistinguishable from added noise.

Typical communication signals, radar signals and channelized wideband electronic warfare signals have a bandwidth as high as 1-2 GHz. Thus, it is desirable to have a large FM Index and a maximum frequency excursion that may be in excess of 10-20 GHz. One example of a state-of-the-art device is described in *IEEE J. Sel. Topics Quantum Electronics* V.1, pp. 461-465 (1995). This device could serve as the Master Oscillator (MO) used in the disclosed embodiments of the present invention. The FM efficiency achieved is approximately 1 GHz/mA and decreases with higher average drive current. This device has RAM that results in an intensity modulation of approximately 0.18 mW/GHz. A maximum frequency excursion in excess of 80 GHz was obtained as well as a flat modulated-frequency response to 20 GHz. This device is suitable for most FM applications. However, even for a maximum frequency excursion of 10 GHz, and an average output power of 7 mW (which is approaching the limit of the maximum frequency response), the RAM is 1.8/7 or 0.26. Thus, the SNR of an OFM Link incorporating this laser cannot be better than 6 dB. The RAM produced by this FM laser must be suppressed or dampened in order to achieve a higher SNR. As an alternative to direct modulation of the laser, a separate, external modulator is usually recommended for OFM transmitters, to achieve lower RAM. A phase modulator is often used, with the phase modulation rate corresponding to the amount of frequency modulation desired. However, that approach makes the OFM transmitters and the drive electronics for those transmitters more complicated.

Typically, a high-power OFM transmitter is obtained by amplifying the output of a single OFM laser, generally with an optical-fiber amplifier. This amplifier can produce a maximum output level of 20-25 dBm, but faithfully amplifies the RAM fed to it from the FM laser. The amplifier also adds even more amplitude noise in the form of relative intensity noise (RIN).

Optical injection locking of an array of slave lasers (SL) to a single master oscillator (MO) has been reported by many investigators. One example is given in *Appl. Phys. Letters*, v.50, pp. 1713-1715 (1987). In much of the known work, both the MO and the SLs are operated CW (continuous wave), with DC drive currents. The goal of the injection locking is generally to achieve mutually phase-locked operation of the multiple SLs and thereby obtain a diffraction-limited, high-power output beam from the array of SLs. Use of a frequency-modulated MO to injection lock multiple SLs is apparently unknown.

Optical injection locking of different SLs to different modulation sidebands of an amplitude-modulated MO is described in *J. Lightwave Technol.*, v.6, pp. 1821-1830 (1988). In this work, each SL is tuned to have a different free-running wavelength that is matched to a different modulation sideband of the MO output. Although the MO is amplitude modulated, there is some accompanying frequency modulation. In contrast to the present invention, wherein each SL output is at the same wavelength, the outputs of the SLs in this prior-art approach are at different wavelengths. These wavelengths can be used for different WDM channels or pairs of those wavelengths can be used to generate RF signals, by means of optical heterodyning.

OFM can be used in a number of applications, including communication applications. For example, free-space optical links with OFM are useful for both terrestrial and inter-satellite communications. A typical wavelength for such communication links is 1550 nm.

OFM can be used in other applications, including remote sensing applications. For example, an ultra-sensitive method for detecting trace amounts of chemical or biological compounds is FM-DIAL or frequency modulation spectroscopy. This method requires a frequency-modulated optical source whose wavelength corresponds to the wavelength of the chemical feature being detected. Such wavelengths could cover the range from ultra-violet to the far infrared. Residual amplitude modulation could reduce the sensitivity of this technique, although techniques could be developed to compensate digitally for that effect since the RAM is predictable. Also, for this application, a portion of the transmitted signal can be made available to the receiver for coherent detection and processing.

Remote sensing can be used to detect pollutants and biological and/or other materials harmful to human beings or other life forms and to detect other chemicals of interest in a myriad of applications. The basic architecture involves a single Power Oscillator (PO) or a combination of multiple power oscillators arranged in parallel so that their optical outputs are combined.

In terms of the remote sensing art, the prior art includes modulated power oscillators, which are limited in sensitivity by RAM. RAM can corrupt the desired signals to be processed. As indicated above, the presence of the species to be detected is inferred by its effect on the amplitude and phase of the ensemble of sidebands, which can be compromised by RAM. Since, in the prior art, the same diode laser is used as the modulation source as well as for the generation of high output power, system tradeoffs are inevitable in terms of output raw power, generation of the required spectrum (high-index FM modulated sidebands) and low RAM. The present invention enables one to address all these metrics separately in the system by optimization of the modulation parameters at the MO Level, and power scaling at the SL level.

Figure 1A:
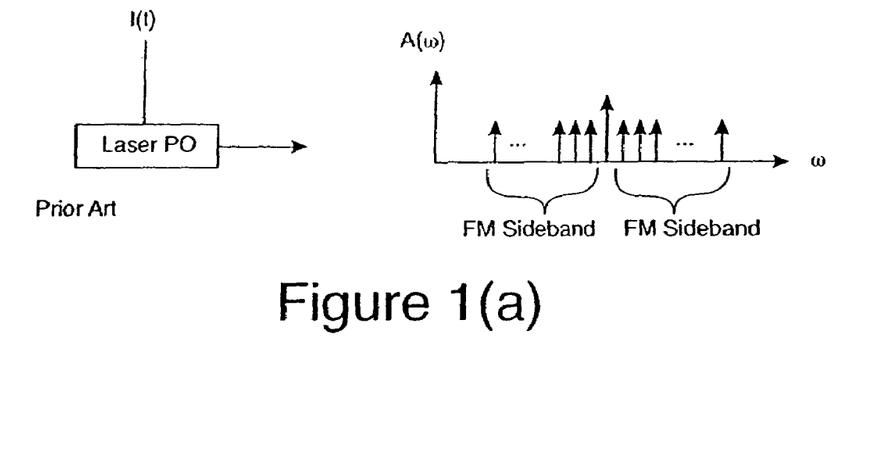
FIG. 1(a) is a schematic diagram of a prior art, single power oscillator with high-index FM modulation whose sidebands are generated by directly modulating a diode layer with a large frequency excursion.

In the prior art (see FIG. 1(a)), a single diode laser has been employed for remote sensing, using a modulated electrical current supply to frequency modulate the transmitter source. However, its power output scalability and sensing range are constrained since diode lasers have maximum output powers on the order of about 500 mW. (For remote sensing applications at infrared wavelengths, quantum cascade lasers may be employed, typically owing to their desirable output wavelength range and tunability. However, such lasers have somewhat lower maximum output powers.) In addition, the ultimate sensitivity is limited in this prior art system due to RAM on the output signal.

Figure 1B:
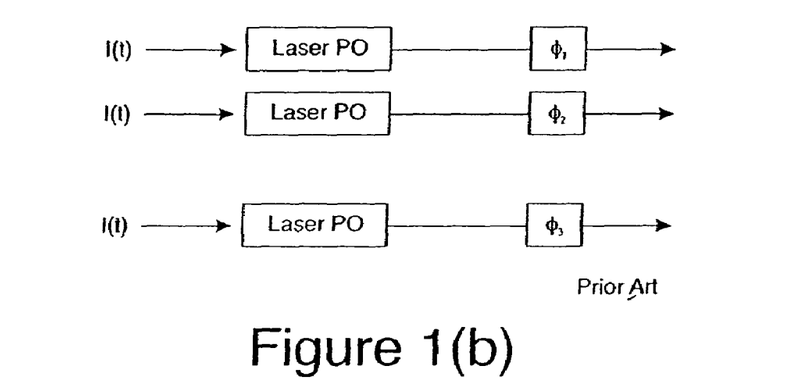
FIG. 1(b) shows a prior art technique for power scaling and wave front coherence of multiple power oscillators of FIG. 1(a)

The prior art depicted by FIG. 1(a) shows a power oscillator (PO) that is a directly modulated diode laser. As pointed out above, this approach demands that a single device be simultaneously optimized in terms of its output spectral purity, low residual amplitude modulation (RAM), high modulation index (required for robust FM modulation spectroscopy) and high optical output power, with thermal loading and optical damage of the components as constraints. Such an approach requires that engineering tradeoffs be made amongst these parameters. Moreover, in order to scale such an approach to still higher powers, separate power supplies are required for the modulation, which increases the size, weight, cost, and complexity of the scaled system. Moreover, in the prior art, as more POs are added for scaling of the output power upwards, any phasing of the wavefront produced by the combination of POs must be accomplished at the high-power optical output ports, thereby placing even greater demands on the power handling capability and size of the phase shifters, etc., as illustrated in FIG. 1(b).

Thus, there is a need for an approach to produce an effective amplification of the FM laser output while suppressing that laser's RAM. The present invention achieves that goal. Furthermore, even higher output level can be attained with the present invention because it combines the outputs of multiple SLs, each of which can have an output level that exceeds 20 dBm.

This invention can generate a high-power frequency modulated optical beam with reduced residual amplitude modulation. The invention preferably includes a frequency modulated master oscillator (MO) that optically injection locks multiple slave lasers (SLs), which receive constant (DC) current drives. The outputs of the multiple SLs are then combined into a single output optical beam using known techniques. Since the multiple SLs are injection locked to the same MO, they are frequency locked and thus phase locked (but not necessarily in phase) with each other. Because the gain of each SL is preferably clamped, residual amplitude modulation of the injection source (the MO) is overcome by the clamping. High output power is achieved because the optical injection ratio can be quite low ($10^{-3}$ to $10^{-4}$). Thus, one MO can be used to couple a large number (>100) of SLs. In addition, each SL can be a high-power device (with an output exceeding 100 mW) whereas the MO can be a lower power device that is selected for its frequency-modulation properties. The phase of each SL output depends on the wavelength detuning between the wavelength of the MO and the free-running wavelength of that SL, which can be adjusted by its drive current and/or temperature or by other means such as controlling the length of the optical path of each SL. Thus, the relative phases of the multiple SL outputs can be controlled and this is preferably done by controlling the electrical drive currents of each SL independently. The relative phases of the SLs can be set to achieve beam shaping or steering.

The maximum frequency modulation (FM) bandwidth of this transmitter is limited by the injection-locking bandwidth of the SL. This locking bandwidth is typically 1-2 GHz (half bandwidth). Another embodiment places each SL in a homodyne phase-lock loop that compares a portion of the outputs of the MO and that SL to generate an electrical error signal for the SL. By combining optical injection with the phase-lock loop, the injection locking bandwidth can be increased by about an order of magnitude, to beyond 10 GHz.

Figure 1C:
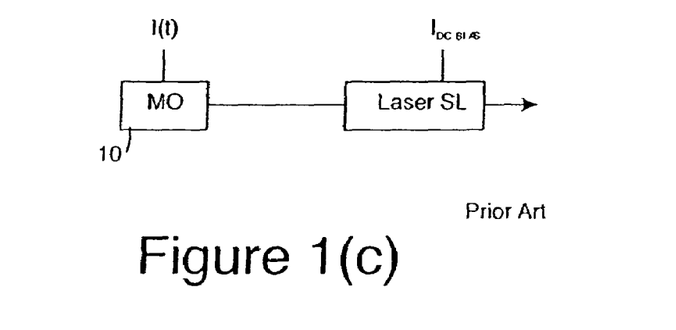
FIG. 1(c) shows a prior art laser MO which injection locks a single SL.

It is well known that the RAM of a frequency modulated diode laser can be mitigated by using that laser as a MO to injection lock a single subsequent SL. An analysis of this RAM mitigation is described in *J. Lightwave Technology* V.16, pp. 656-660 (1998). According to this article, a MO injection-locks a single SL as is illustrated by FIG. 1(c). The MO is modulated (modulation examples are discussed below) and it, in turn, drives the SL. For an arbitrary modulation format, the function of the SL is to intensify the MO signal, while preserving the modulation encoding, which is typically a high-index FM format with many narrow-linewidth sidebands (see FIG. 1(a)). A key advantage of this architecture is that there is minimal RAM by virtue of the injection-locking approach relative to other approaches (e.g. MOPAs, direct modulation of power oscillators).

As is disclosed herein, the OFM transmitter can be scaled upward in power by using the MO to drive a set of POs in parallel, or, in another embodiment, a cascade architecture can be employed that utilizes the MO, followed by an intermediate PO, which, in turn, injection locks yet another set of higher power POs in parallel. Each PO is a slave laser to the PO or MO that precedes it. Since the injection-locking architecture provides for both frequency as well as phase-locking of the PO to the MO, precise overall wavefront control of the system can be realized by using optical phase shifters placed between the MO and each of the POs (assuming single-transverse-mode operation of the POs), so that minimal side lobe structure and speckle result from the composite system. Modulation techniques include current modulation of the MO and the use of external modulators, such as optical waveguide phase modulators and optical MEMS-based phase modulators. Since the modulation is performed at a low power portion of the system, a variety of compact, low-voltage and low-power-consuming integrated optical modulators can be used, which would otherwise be impractical for use in high-power laser oscillators. The system is robust; if a given PO fails the system experiences graceful degradation. Finally, only one compact modulator is required, which resides in the low power portion of the system (internal to the MO or external to the MO). This is the case even as the system is scaled in total power, as opposed to the need for a set of separate modulators to service each of the POs (with the concomitant high-power handling requirements), as in the prior art.

BRIEF DESCRIPTION OF THE INVENTION

In one aspect the present invention provides an optical frequency modulated transmitter comprising: a plurality of slave lasers, each slave laser in said plurality of slave lasers being supplied a separate DC bias current, each of the slave lasers having an output, the outputs of the plurality of slave lasers being combined to form a single output beam of the optical frequency modulated transmitter; and a master oscillator for injection locking said plurality of slave lasers, the master oscillator being frequency modulated.

In another aspect, the present invention provides a method of frequency modulating an optical beam comprising: providing a plurality of slave lasers, each of the slave lasers having an output, the outputs of the plurality of slave lasers being combined to form the optical beam; injection locking the plurality of slave lasers to an optical output of a master oscillator; frequency modulating the optical output of the master oscillator before the optical output thereof is applied to the plurality of lasers; and individually phase controlling the slave lasers of the plurality of slave lasers.

DETAILED DESCRIPTION

Figure 2A:
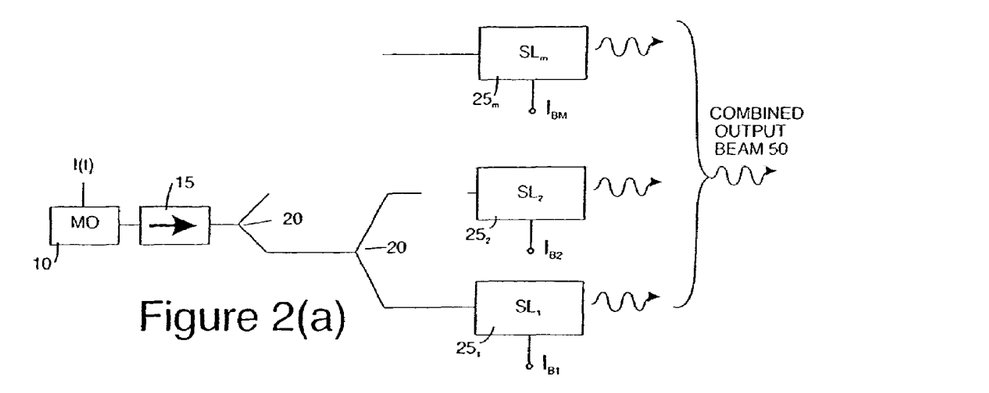
FIG. 2(a) is a schematic diagram of one embodiment of a high-powered, optical-FM transmitter in accordance with the present invention.

A basic configuration for a high-power optical FM transmitter or generator is illustrated by FIG. 2(a). An externally modulated version of a high-power optical FM transmitter/generator will be discussed later with reference to FIG. 2(b). In the embodiment of FIG. 2(a), a single laser 10 is frequency modulated, generally by application of a modulation current I(t), in addition to a DC bias current. A modulation voltage and/or a DC bias voltage could also be applied. That laser serves as a master oscillator (MO) 10 for injection locking a set of slave lasers (SLs) $25_1, 25_2, \ldots 25_m$. The drive currents (or drive voltages) for these SLs $I_{B1}, I_{B2}, \ldots I_{BM}$ are DC currents (or voltages) whose values may be different for each SL. The optical output from the MO is divided among the set of SLs. The outputs of the SLs are combined to form a single output beam 50 of the transmitter. One way to divide the output of the MO is to use optical fiber (or optical waveguide) power splitters at dividing points 20. By adjusting the relative phases of the SL 25 outputs, their combined output beam 50 can be narrowed and shaped. Preferably, one or more optical isolators 15 are placed between the MO 10 and SLs 25 to prevent unwanted injection of light back into the MO 10 from the SLs 25. Also, both the MO 10 and the SLs 25 are preferably devices that output light of a single wavelength. An example of a single wavelength laser is a distributed feedback (DFB) diode laser.

Injection locking of a slave laser by a separate MO 10 is well-known. As a result of the optical injection, the output wavelength (or frequency) of the SL is pulled to that of the MO, even though the wavelength of a free-running SL (without injection) would be different from that of the MO. The injection locking properties of a SL are typically characterized by its locking bandwidth for a given value of optical injection ratio. The locking bandwidth is the amount of positive and/or negative wavelength (or frequency) detuning that can be tolerated and yet result in stable injection locking of the SL to the MO. The frequency detuning is the difference between the output frequency of the MO and the frequency of a free-running SL. The optical injection ratio is often defined as the ratio between the injected optical power (from the MO) and the power emitted from the SL. The injection locking properties are different for different models or specific designs of SL. Two examples of SL performance are shown in FIGS. 2(c) and 2(d).

Figure 2B:
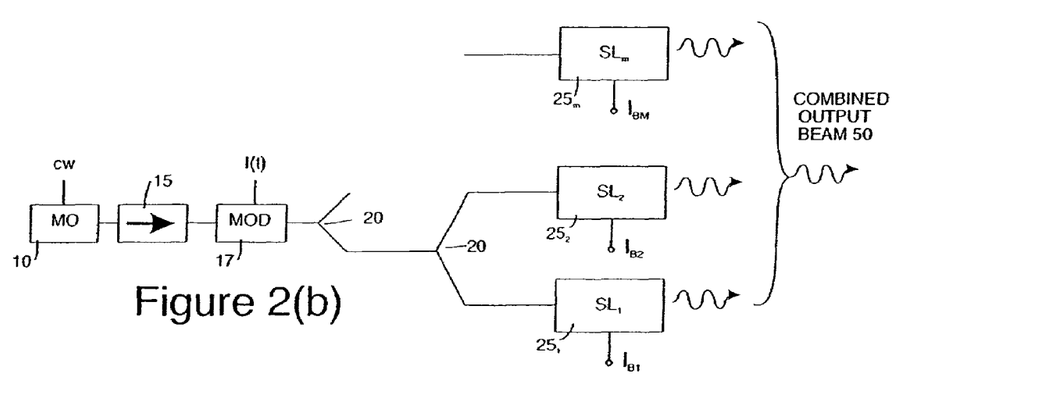
FIG. 2(b) is a schematic diagram of an externally modulated version of the present invention.
Figure 2C:
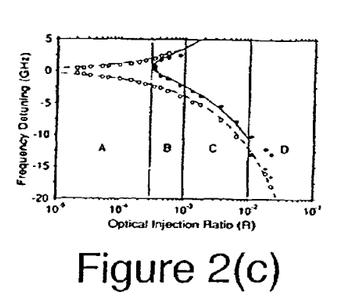
FIG. 2(c) is a graph which depicts the bandwidth for stable injection locking versus optical injection ratio, for two devices reported in the literature, this FIG. 2(c) showing the measured results.

The data shown in FIG. 2(c) was measured for a DFB laser and was reported in *IEEE J. Quantum Electronics*, v.27, pp. 1688-1695 (1991). Stable injection locking was observed for the values of frequency detuning bounded within the open and closed circles. For region A, stable injection locking was observed for small values of detuning, with locking half-bandwidths up to about 2 GHz, for small values of injection ratio (below $3 \times 10^{-4}$). In this region, larger values of detuning resulted in loss of locking. For larger injection ratios, regions B, C and D, stable injection locking was observed for negative values of detuning. The locking bandwidth is quite narrow for regions B and C. However, as the injection ratio increases, the locking bandwidth increases. Note that as the injection ratio reaches −20 dB and higher, the locking bandwidth can be greater than 5 GHz, as represented by region D. The data shown in FIG. 2(d) was calculated from the laser rate equations and was reported in *J. Lightwave Technology*, v.17, pp. 328-342 (1999). The optical injection ratio defined for the calculated results also includes the group velocity and the effective length of the SL. One key feature to be noted from this figure is that for very high injection levels, stable locking is predicted for a large range of detuning values, in excess of 10-15 GHz.

When frequency modulation is applied to a MO 10, its output does not have just a single wavelength (see FIG. 1(a)). Instead, the output spectrum of the MO 10 also contains a set of sidebands that move with time as the amount of frequency modulation changes. Injection locking with a frequency modulated MO 10 has been studied and was reported in *IEEE J. Quantum Electronics*, v.18, pp. 575-581 (1982). One key result of this study is that the SL, which was driven by a DC bias current, has an output spectrum resembling that of the frequency modulated MO 10. As the modulation frequency of the MO 10 approaches the limit of the injection locking bandwidth, the strength of the FM sideband in the SL 25 spectrum becomes smaller. In fact, when the modulation frequency was ten times the frequency determined by the locking half bandwidth, the SL sideband was reduced by a factor of ten. Therefore, in order for a SL to reproduce the frequency modulation of the MO accurately, the modulation frequency (and the first FM sideband) should be kept below the locking half bandwidth of the SL. Complete reproduction requires that the full frequency excursion, including all of the sidebands, be kept within the locking half bandwidth.

Figure 2D:
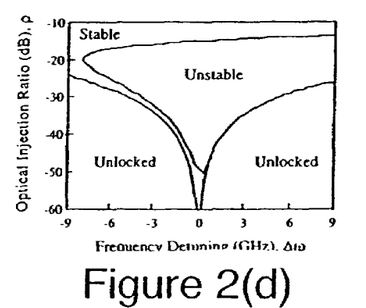
FIG. 2(d) is a graph similar to FIG. 2(c), but shows the results of theoretical calculation as opposed to measured results.

The suppression of residual amplitude modulation (RAM) in the MO output by the injection locked SL may be understood from FIG. 2(d). As long as stable locking is maintained, any value of the MO power will result in faithful reproduction of its FM spectrum. For operation in region A of FIG. 2(c), the MO power is such a small percentage (less than −35 dB) of the SL power that variations of the MO power due to RAM will have a small effect on the SL power. Note that in this case the signal-to-noise ratio (SNR) of an OFM communications link, for example, utilizing this injection-locked transmitter could be better than 35 dB, which is significantly better than what could be achieved with a RAM limited SNR.

Another benefit of the low optical injection ratio is that the SL can be a high-power device whereas the MO can be a low-power device, or have its output divided among a large number of SLs. As an example, consider a fairly typical high-power DFB laser with an output power of 100 mW (20 dBm) for the SL. Also, consider a MO, such as the one described above, with an output power of 10 mW (10 dBm). This MO laser could be used to injection lock more than 100 SLs. The total output power from the 100 SLs could be as high as 10 watts. In comparison, the prior-art approach of using an optical fiber amplifier to amplify the MO output is limited to an output power of several hundred mW.

Although optical injection locking pulls the frequency of the SL to be that of the MO, the phase of the SL output need not be the same as that of the MO. Instead, the phase of the SL output is determined by the frequency detuning. This effect also has been studied previously and is reported in *IEEE Trans. Microwave Theory and Techniques*, v.30, pp. 1650-1657 (1982). The authors of that work observed that a phase shift of π took place when the SL bias current was changed by less than 0.5 mA. The threshold current of that SL was 6 mA. The authors also reported that the phase shift per unit of drive current is greater when the injection-locking bandwidth is smaller.

The relative phases of the various SLs 25 that are locked to the same MO 10 need to be controlled for a number of reasons which are discussed in some detail below. Phase control can be obtained theoretically in a number of ways, such as by controlling the lengths of the optical paths between the MO 10 and each SL 25 or by inserting a phase delay element in each such path. However, the phase of each SL 25 can be conveniently set to different values by adjusting their drive currents to achieve different detunings. This feature of phase adjustment of the SLs by controlling their drive currents $I_{B1}, I_{B2}, \ldots I_{BM}$ is the preferred way of controlling the phases of the SLs 25 in accordance with the present invention. Otherwise, it is difficult to control precisely the lengths of the optical paths between the MO 10 and each SL 25 to the precision of a fraction of the optical wavelength and the insertion of a specific phase control element in each optical path complicates the disclosed embodiment. However, some practicing the present invention may elect to utilize such non-preferred techniques or other techniques to control the phase of the light emitted by each SL. Phase variations can be produced by the optical power splitters, such as by elements 20. In the disclosed OFM transmitters, the phases of the SL outputs may be adjusted, for example, so that those outputs add constructively when they are combined.

Wavefront coherence is obtained when the phases of the light emitted from the multiple SLs have a fixed relation to each other. For example, if the beam 50 produced by the combination of SLs points broadside (i.e. normal to a wavefront plane defined by the SLs), the phases of the light from the SLs are the same, within a modulus of $2\pi$.

Another advantage of having different and adjustable SL phases is to achieve beam steering. An embodiment of the present invention, which makes use of the phase control mechanism described above to achieve beam steering, is shown in FIG. 3. In this embodiment, the SLs are arranged as an m×n array of light emitters that resemble an optical phased array. By properly adjusting the relative phases of the m×n SLs in the array, the beam 50 can be steered. The SLs in the two dimensional array each have a pair of subscripts which respectively fall in the ranges of 1 to m and a to n. Thus, the SLs are identified as elements $SL_{1a}$–$SL_{mm}$.

Figure 3:
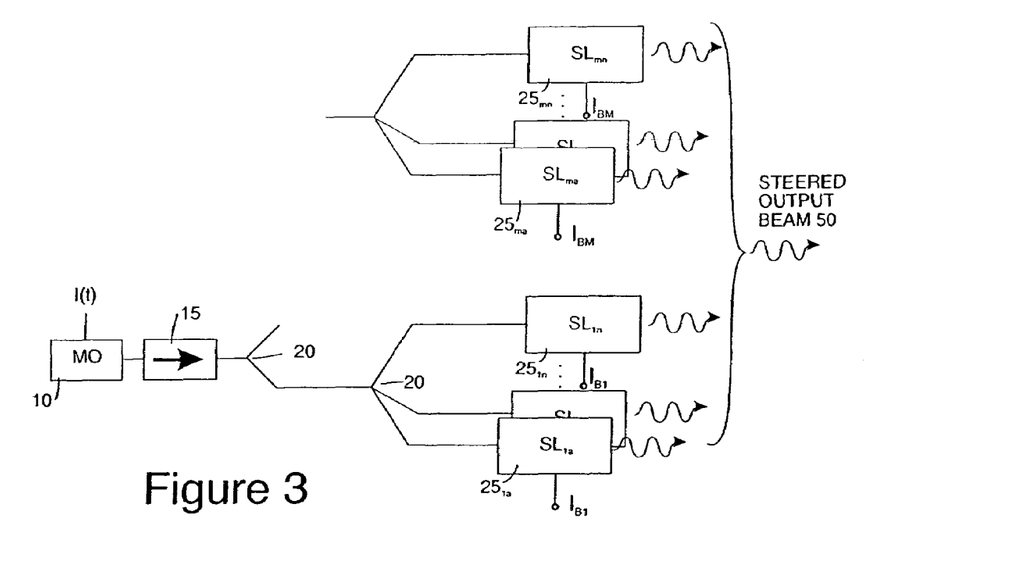
FIG. 3 is a schematic diagram of an alternative embodiment of the present invention where the output beam can be steered.

The principles of beam steering with a phased array are well known and therefore need not be discussed further in this document. Note that the maximum phase shift that would be needed four a given SL is only $2\pi$. A diffraction-limited output beam has already been achieved with an array of injection-locked lasers, as discussed above. The present invention adds the possibility of a beam steering capability in addition to the frequency modulation of the MO. It should be noted that the SLs can be arranged as a 2-dimensional array to achieve a narrow beam (in both dimensions of the array) that can be steered in those two directions.

Figure 4:
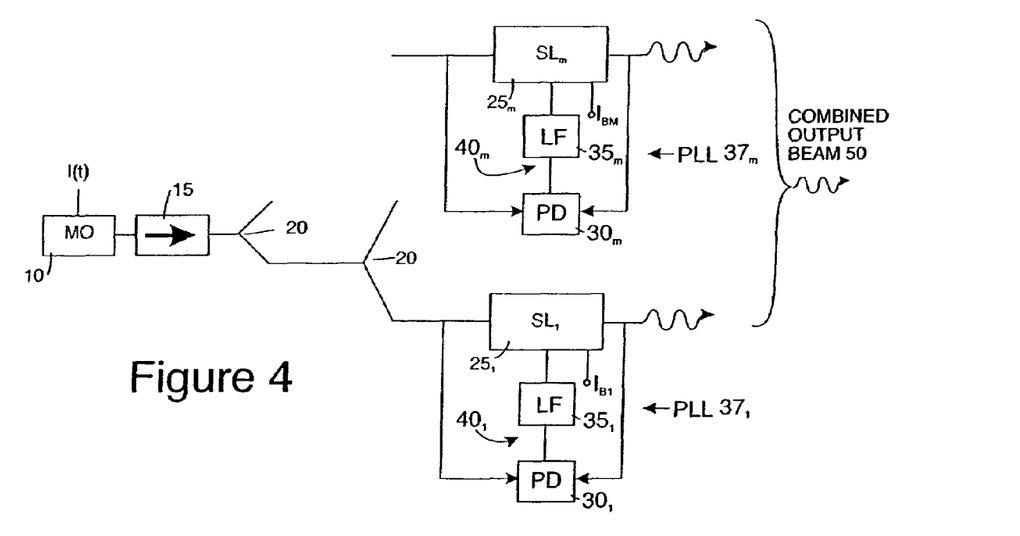
FIG. 4 is a schematic diagram of yet another embodiment of the present invention, this embodiment achieving enhanced modulation index as a result of additional phase-lock loops.

The data shown in FIG. 2(d) suggests that the maximum frequency excursion is limited by the injection-locking bandwidth to being only a few GHz (for moderate values of the optical injection ratio, i.e., −20 dB or lower). Although one could probably operate at fairly high (>−10 dB) optical-injection ratios, the benefit in reducing the effect of RAM is diminished. For example, a locking half bandwidth of 10 GHz was reported for an injection ratio of −6 dB in *IEEE Trans. Microwave Theory and Techniques*, v.47, pp. 1172-1176 (1999). However, with this injection ratio, the amount of amplification achieved is only 6 dB, at best, and the SNR would be improved to only 12 dB, at best. Another way to achieve a large frequency excursion for moderate frequency modulation rates is to combine optical injection locking with an optical phase-lock loop. This approach is described in *J. Lightwave Technol.*, v.17, pp. 328-342 (1999). The authors of that work observed an improvement in the injection locking half bandwidth from 0.5-2 GHz to beyond 15 GHz or higher with the combined approach. An embodiment of the present invention that also incorporates an optical phase-locked loop (PLL) 37 for each SL 25 is illustrated in FIG. 4. In this embodiment, each PLL 37 contains a differential photodetector (PD) 30, an electrical loop filter (LF) 35 and an electrical feedback path 40 connected to an associated SL 25. A portion of the MO output is diverted to each differential photodetector 30. In addition, a portion of the SL output is diverted to the differential photodetector 30 of the PLL 37 for that SL 25. The PLL 37 generates a correction current to drive its associated SL 25, which supplements the SL's associated bias current $I_{B1}$–$I_{BM}$. In FIG. 4 the PD 30, the LF 35 and the electrical feedback path 40 and the PLL 37 each have a subscript associated therewith to identify the particular SL $25_1$–$25_m$ with which they are associated.

The PLL 37 operates each PD 30 in a homodyne configuration. The optical outputs from both the MO 10 and the SL 25 are coupled into the PD 30. The PD 30, which serves as the phase detector, is a non-linear device whose electrical output contains mixing products that result from its two optical input signals. In order to increase the sensitivity of the phase detection, the optical path lengths for the MO and SL signals may be selected so that those signals are in phase-quadrature when they arrive at the PD 30. Preferably the SL 25 and PD 30 are incorporated into a photolithograpically defined, integrated photonic-waveguide circuit in order to set and control those path lengths. As discussed below, the path lengths involved will be quite small, typically less than 5-10 mm. Also, the path-length accuracy must be better than a fraction of an optical wavelength. Note that the SL and PD combination actually could be implemented by using two laser devices that could be located on the same chip, with one device forward biased and operating as a SL 25 and the other device reverse biased and operating as a PD 30.

Use of a PLL 37 is more appropriate when the frequency modulation rate is moderate and a large frequency excursion is desired. The frequency modulation rate is limited by the bandwidth of the loop filter (LF) 35. That bandwidth is limited by the propagation delay time of the feedback loop 45. This relationship is discussed in *SPIE Proceedings*, v.3160, pp.142-153 (1997). The authors of that work reported that a filter bandwidth approaching 1 GHz could be achieved if the loop delay is less than 100 psec. This short delay corresponds to a distance of only 3 cm (for propagation of light in free space). An integrated, preferably monolithic, PLL would be most appropriate in this case. Such an integrated circuit is quite feasible. Monolithic integration of photodetectors with resistors, inductors and capacitors has already been achieved and was reported in *Electronics Letters*, v.33, pp.1078-1079 (1997). For most anticipated applications, the frequency-modulation index exceeds unity. In these cases, a LF 35 with adjustable bandwidth may be needed if the modulation rate is not fixed. The bandwidth of the LF 35 would then be adjusted to respond to the modulation rate but remove the effects that arise from intermodulation terms produced at the PD 30 as a result of the large number of FM sidebands.

Turning again to FIG. 2(*b*), as previously mentioned, this figure relates to another embodiment of the present invention. In this embodiment, the MO 10 is driven by a continuous wave (cw) DC signal instead of by modulated signal I(t). The output of MO 10 is thus a single line optical signal that is subsequently modulated to produce a FM signal by a modulator 17. Preferably, one or more optical isolators 15 is placed between the MO 10 and SL 25 to prevent unwanted injection of light back into the MO 10 from the SL 25. Whether the MO 10 itself is modulated to produce a FM optical signal or a separate modulator 17 is used is much a matter of design choice; however, depending on the particular components utilized, the RAM in the signal input into SL 25 can be decreased by utilizing a separate modulator 17. The other embodiments disclosed herein can be easily modified to utilize a separate modulator 17 as opposed to or in conjunction with effecting modulation of the light in the MO 10. In the embodiments of FIGS. 3-6, if a separate modulator such as modulator 17 is employed, it is preferably placed between the optional optical isolator 15 and the first power splitter at the first junction 20 downstream of the optional optical isolator 15.

Figure 5:
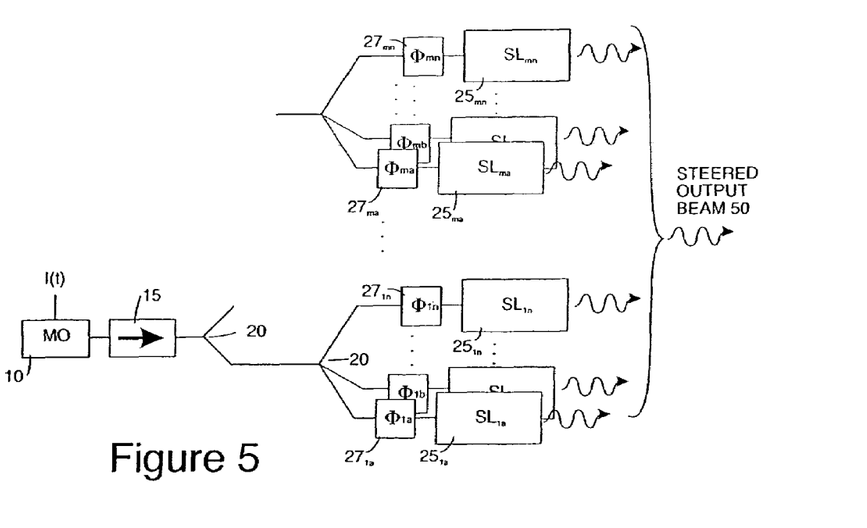
FIG. 5 is similar to FIG. 3, but instead of controlling the current to the slave laser to adjust its phase, a separate phase shifter is utilized.
Figure 6:
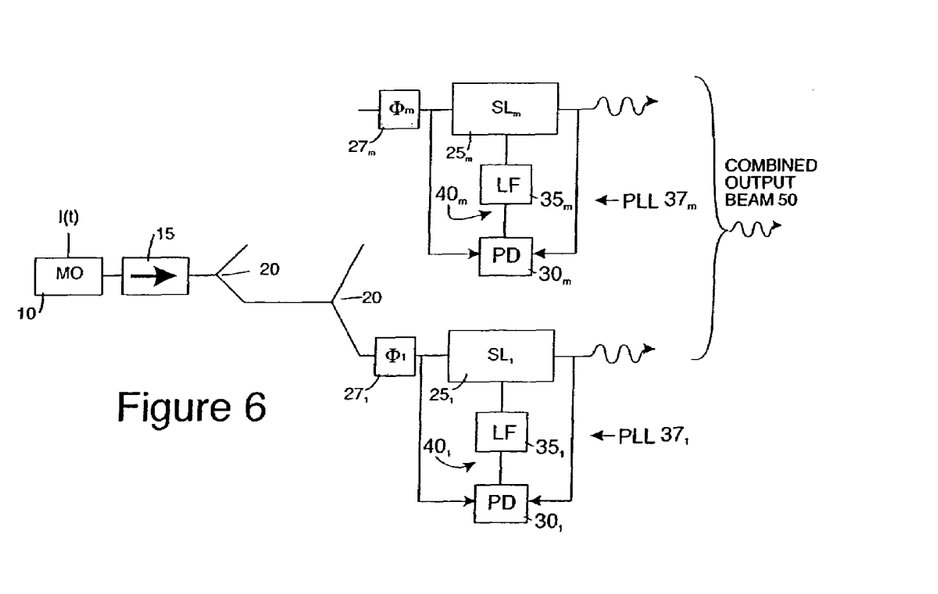
FIG. 6 is similar to FIG. 4, but instead of controlling the current to the slave laser to adjust its phase, a separate phase shifter is utilized.

In the embodiments of FIGS. 2(*a*), 2(*b*) 3 and 4, the DC bias current $I_B$ to the SLs 25 is preferably controlled to adjust the phase of the light emanating from SLs 25. In lieu of adjusting the phase of the light emanating from each SL 25, the phase can also be adjusted externally of the SLs 25 by providing an external phase shifter 27 preferably located upstream of an associated SL 25 as is illustrated by the embodiments of FIGS. 5 and 6, which are similar to the embodiments of FIGS. 3 and 4, respectively.

Figure 7:
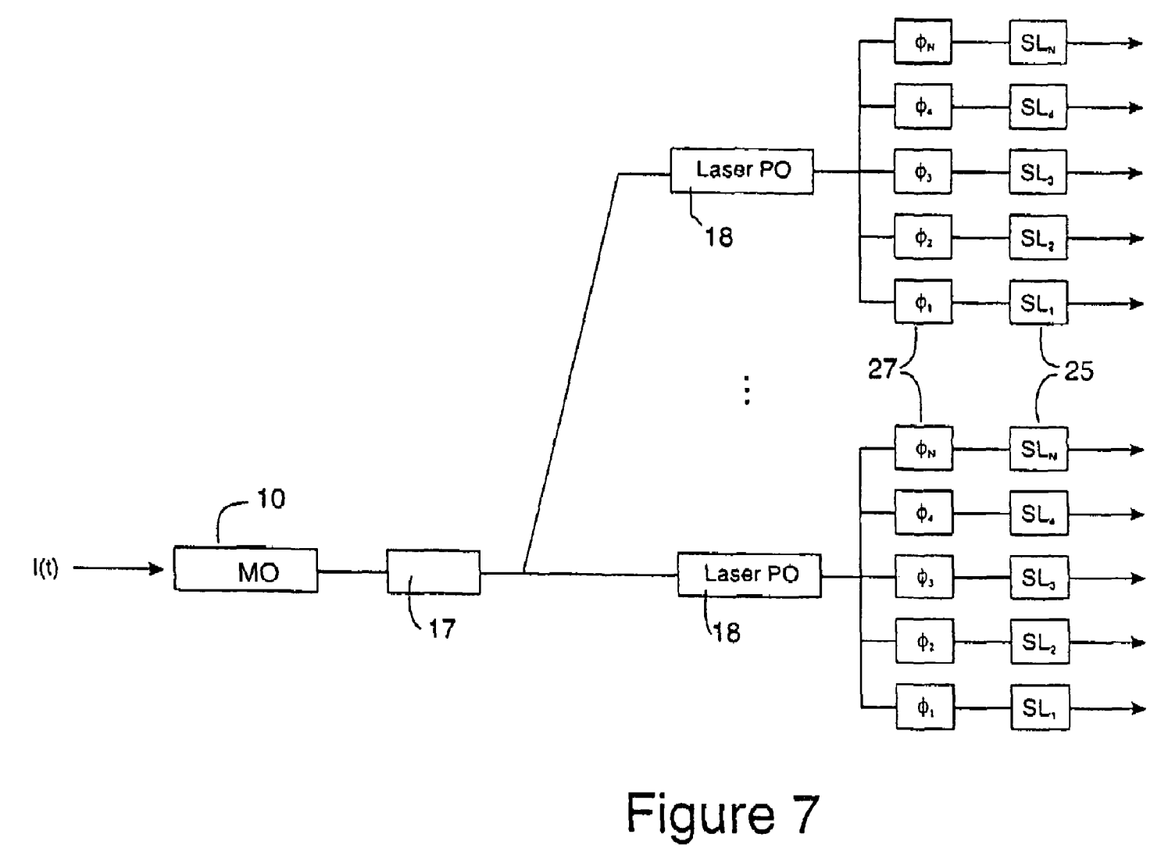
FIG. 7 is a modified version of the embodiment of FIG. 2(b) showing a plurality of power oscillators that are injection locked by a single MO.

FIG. 7 depicts a master oscillator (MO) 10, followed by a series or cascade of slave lasers 25 and power oscillators (POs) 18, the latter of which are injection-locked by the MO 10. In this manner, the MO 10 can be optimized for spectral purity and minimal RAM, while the POs 18 and SLs 25 can be optimized in terms of raw output power. The modulation can be encoded via modulating the MO 10 drive current (as has been previously described), via intracavity MEMS-based schemes that change the effective cavity length of the MO, or via external cavity modulators (E-O, O-MEMS, etc.) such as modulator 17 mentioned with reference to FIG. 2(*b*). Note that the modulator 17 is placed in the MO leg of the system, thereby reducing the size and optical power handling requirements of these devices. Hence, compact, fiber or waveguide devices can be used for the FM modulator 17. Optional optical phase shifters 27 (which can be E-O, O-MEMS, etc.) can be placed in the low-power legs to achieve wavefront coherence of scaled systems. One or more optical POs 18, which increase the power injected into the downstream SLs, are injection locked to the MO 10. Each of the SLs is then, in turn, injection locked to the PO 18 that precedes it in the cascade. This additional PO or POs 18 increase the injection level delivered to the parallel SLs 25 to ensure that the entire ensemble is properly injection locked over the bandwidth required for the wideband, high-modulation-index output spectrum.

The use of optical injection locking of one or more SLs 25 to a single MO 10 can be used for a transmitter intended to achieve high modulation index and high output power for FM spectroscopy. Such remote-sensing applications generally require low modulation rates (10 MHz or below) but frequency modulation indices of 1000 or higher. In contrast, the communications applications of the present invention may well require modulation rates approaching 1-2 GHz and modulation indices of 10-100.

The high modulation index results in a comb of frequencies with small separation (to minimize the dispersive effects of the atmosphere over long interrogation paths), while enabling one to employ FM modulation spectroscopic processing to determine the presence of the species to be sensed remotely. A challenge, however, is to realize a high-power system (in the multi-watt range), with good wavefront quality and low residual amplitude modulation, the effects of which limit the detection sensitivity of the system. By employing a low-power master oscillator 10 and modulation techniques (internal or external to the laser 10) to serve the function as a high-quality (i.e., spectrally pure) modulation source and a set of SLs 25 for power scaling, each system requirement can be separately optimized. Moreover, since the use of injection-locking techniques can enable such a system to be realized with minimal RAM, the overall system sensitivity can be enhanced. Additionally, the system can be scaled by placing one or more power oscillators 18 in the architecture (as shown in FIG. 7, for example). Finally, the wavefront quality can be controlled (see FIG. 3) by adjusting the bias current of the SLs 25 or through the use of low-power-handling, compact optical phase shifters 27, each placed prior to the respective ensemble of SLs 25 (see FIG. 5), or by use of a PLL 37 for each SL 25 (see FIG. 4) or a combination of phase shifter 27 and PLLs 37 (see FIG. 6).

A variety of modulation techniques can be used in a remote sensing application, including both direct modulation of the MO 10 and use of a continuous wave (CW) MO 10 with a separate optical modulator 17. The embodiments of FIGS. 3-6 can be readily modified to utilize external modulation by means of a separate modulator 17 instead of (or in addition to) modulation of the MO 10 itself. The reduction of RAM by optical injection locking the SLs 25 and POs 18, if used, is an advantage of the present invention irrespective of its application. Wavefront coherence can be achieved for the array of SLs by the addition of optical phase shifters 27 that are separate from the SLs. However, wavefront coherence is preferably obtained by having phases of the phase locked SLs adjusted by adjusting their drive currents. Hence the present invention can utilize, but does not require, a separate phase shifter in the optical path of each SL. Additionally, the present invention can provide for beam steering, by controlling the phases of the SLs. Finally, the present invention can employ a phase-lock loop to extend the bandwidth of the disclosed injection-locking approach.

Having described the present invention in connection with a number of embodiments thereof, modification will now certainly suggest itself to those skilled in the art. As such, the invention is not to be limited to the disclosed embodiments, except as required by the claims.

The invention claimed is:

1. An optical frequency modulated transmitter comprising:
   (a) a plurality of slave lasers, each of the slave lasers having an output, the outputs of the plurality of slave lasers being combined to form a single output beam of the optical frequency modulated transmitter, the lasers of the plurality of slave lasers being separately phased-controlled;
   (b) a master optical oscillator which outputs an optical signal for injection locking said plurality of slave lasers, the optical signal outputted by the master oscillator being frequency modulated directly in the master optical oscillator or externally thereof; and
   (c) a plurality of power oscillators arranged in a cascade arrangement upstream of the plurality of slave lasers and wherein the plurality of slave lasers are arranged in a plurality of groups thereof, each group of slave lasers being injection locked to a separate one of the power oscillators of the plurality of power oscillators.

2. The transmitter of claim 1, wherein optical signal outputted by the master oscillator is modulated in an external modulator.

3. The transmitter of claim 1, wherein the master oscillator is modulated in response to an application of a modulation current or voltage thereto to thereby modulate the outputted optical signal.

4. The transmitter of claim 3, at least one optical isolator disposed between said master oscillator and said plurality of slave lasers to prevent unwanted injection of laser light back into the master oscillator from the slave lasers.

5. The transmitter of claim 4, wherein the master oscillator and the plurality of slave lasers are each optical devices which output light of a single carrier frequency.

6. The transmitter of claim 1 wherein a bias current or voltage is applied to each slave laser for adjusting the phase thereof relative to other slave lasers in said plurality of slave lasers.

7. The transmitter of claim 6 wherein adjusting the phase of one slave laser relative to other slave lasers in said plurality of slave lasers causes the single output beam of the optical frequency modulated transmitter to be steered.

8. The transmitter of claim 1 wherein the slave lasers in addition to being injection locked to the master oscillator, are each arranged in a phase locked loop.

9. The transmitter of claim 1 wherein adjusting the phase of one slave laser relative to other slave lasers in said plurality of slave lasers causes the single output beam of the optical frequency modulated transmitter to be steered.

10. The transmitter of claim 1 wherein the slave lasers in addition to being injection locked to the master oscillator, are each arranged in a phase locked loop.

11. The transmitter of claim 1 further including a plurality of phase shifters, each phase shifter of said plurality of phase shifters being associated with and coupled upstream of one slave laser of said plurality of slave lasers for adjusting the phase thereof relative to other slave lasers in said plurality of slave lasers.

12. An optical frequency modulated transmitter comprising:
   (a) a plurality of slave lasers, each of the slave lasers having an output, the outputs of the plurality of slave lasers being combined to form a single output beam of the optical frequency modulated transmitter;
   (b) a master optical oscillator which outputs an optical signal for injection locking of said plurality of slave lasers, the optical signal outputted by the master oscillator being frequency modulated directly in the master optical oscillator or externally thereof;
   wherein the lasers of the plurality of slave lasers are injection locked to the master optical oscillator and are separately phased-controlled by a bias current or voltage which is applied to each slave laser for adjusting frequency detuning of said slave laser with respect to said master optical oscillator thereby adjusting the phase of each slave laser relative to other slave lasers in said plurality of slave lasers; and
   (c) a plurality of power oscillators arranged in a cascade arrangement upstream of the plurality of slave lasers and wherein the plurality of slave lasers are arranged in a plurality of groups thereof, each group of slave lasers being injection locked to a separate one of the power oscillators of the plurality of power oscillators.

13. The transmitter of claim 12 further including
   a plurality of phase shifters coupled to the plurality of power oscillators wherein the plurality of phase shifters and the plurality of slave lasers are arranged in a plurality of groups thereof, each group of slave lasers being injection locked to a separate one of the power oscillators of the plurality of power oscillators.

14. A method of frequency modulating an optical beam comprising the steps of;
   providing a plurality of slave lasers, each of the slave lasers having an output, the outputs of the plurality of slave lasers being combined to form the optical beam,
   injection locking the plurality of slave lasers to an optical output of a master oscillator;
   frequency modulating the optical output of the master oscillator before the optical output thereof is applied to the plurality of lasers;
   individually phase controlling the slave lasers of the plurality of slave lasers;
   arranging the plurality of slave lasers in groups; and
   providing a power oscillator for each group arranged in series between the slave laser and the master oscillator whereby the master oscillator injection locks the power oscillator for each group directly and each slave laser indirectly via one of power oscillators.

15. A method of frequency modulating an optical beam as claimed by claim 14, further comprising the steps of:
providing a plurality of slave lasers, each of the slave lasers having an output, the outputs of the plurality of slave lasers being combined to form the optical beam, injection locking the plurality of slave lasers to an optical output of a master oscillator;
frequency modulating the optical output of the master oscillator before the optical output thereof is applied to the plurality of lasers; and
individually phase controlling the slave lasers of the plurality of slave lasers by adjusting a current or voltage applied to each of the slave lasers in the plurality of slave lasers to (i) thereby frequency detune each slave laser with respect to said master laser and (ii) thereby adjust the phase of each slave laser relative to other slave lasers in said plurality of slave lasers.

16. The method of claim 14 wherein the step of individually phase controlling the slave lasers in the plurality of slave lasers is performed in order to steer the optical beam.

17. The method of claim 14 wherein the step of individually phase controlling the slave lasers in the plurality of slave lasers is performed in order to achieve wavefront coherence of the optical beam.

18. The method of claim 14 further including phase locking each slave laser individually utilizing a phase lock loop associated with each slave laser in the plurality of slave lasers.

19. The method of claim 14 wherein the step of individually phase controlling the slave lasers in the plurality of slave lasers is performed by a phase shifter arranged in series between each slave laser in the plurality of slave lasers and the master oscillator.

* * * * *